United States Patent [19]
Satitpunwaycha et al.

[11] Patent Number: 6,159,055
[45] Date of Patent: Dec. 12, 2000

[54] RF ELECTRODE CONTACT ASSEMBLY FOR A DETACHABLE ELECTROSTATIC CHUCK

[75] Inventors: Peter Satitpunwaycha, Santa Clara; Joseph Stevens, San Jose, both of Calif.

[73] Assignee: Applied Materials, Inc., Santa Clara, Calif.

[21] Appl. No.: 09/126,895

[22] Filed: Jul. 31, 1998

[51] Int. Cl.[7] .................................................. H01R 13/24
[52] U.S. Cl. ............................................ 439/700; 439/927
[58] Field of Search .............................. 439/66, 289, 591, 439/927, 886, 887, 840

[56] References Cited

U.S. PATENT DOCUMENTS

| | | | |
|---|---|---|---|
| 3,881,799 | 5/1975 | Elliott et al. | 439/284 |
| 4,015,098 | 3/1977 | Matter et al. | 219/90 |
| 4,897,171 | 1/1990 | Ohmi | 204/298 |
| 4,917,623 | 4/1990 | Grabbe | 439/284 |
| 5,059,143 | 10/1991 | Grabbe et al. | 439/66 |
| 5,061,191 | 10/1991 | Casciotti et al. | 439/66 |
| 5,079,400 | 1/1992 | Firlotte et al. | 219/86.6 |
| 5,348,497 | 9/1994 | Nitescu | 439/824 |
| 5,454,735 | 10/1995 | Nelson | 439/578 |
| 5,691,876 | 11/1997 | Chen et al. | 361/234 |
| 5,764,471 | 6/1998 | Burkhart | 361/234 |

*Primary Examiner*—Brian Sircus
*Assistant Examiner*—J. F. Duverne
*Attorney, Agent, or Firm*—Thomason, Moser and Patterson

[57] ABSTRACT

An substrate support pedestal having an RF contact assembly that utilizes a canted spring to make electrical connection to the cathode. The canted spring has coils that are tilted in one direction and joined end to end to form a doughnut shape. Such a spring creates multiple parallel self-loading electrical connections via the turns of the spring. The turns act like electrical wires to ensure reliable RF electrical energy transfer. The canted spring contact of the present invention allows for flat contact between the pedestal and the chuck.

7 Claims, 3 Drawing Sheets

RF ELECTRODE CONTACT ASSEMBLY FOR A DETACHABLE ELECTROSTATIC CHUCK

BACKGROUND OF THE DISCLOSURE

1. Field of the Invention

The invention relates to design improvements in electrostatic chucks. More particularly, the invention relates to an RF electrode contact assembly for a detachable electrostatic chuck.

2. Description of the Background Art

In semiconductor wafer processing equipment, substrate supports are used for retaining wafers during processing. The wafer rests on a susceptor such as an electrostatic chuck. Electrostatic chucks secure a workpiece by creating an electrostatic attractive force between the workpiece and the chuck. A voltage, applied to one or more insulated electrodes in the chuck, induces opposite polarity charges in the workpiece and electrodes respectively. The opposite charges pull the workpiece against the chuck, thereby retaining the workpiece.

The susceptor is typically mounted to a pedestal in a semiconductor processing chamber. These susceptors find use in etching, chemical vapor deposition (CVD), and physical vapor deposition (PVD) applications. In many applications, the susceptor is heated to high temperatures, typically as high as 175° C. and sometimes as high as 500° C. In many applications, the susceptor contains a cathode electrode that can be biased with direct current (DC) or radio frequency (RF) voltage. Bias voltage is typically supplied by an external power supply through a cable and appropriate feed throughs.

An improvement in the design of susceptors is a detachable electrostatic chuck such as that shown and described in commonly assigned U.S. Application Ser. No. 09/071,784 filed May 1, 1998. Such a chuck is secured to a pedestal but easily removable to facilitate repair and replacement of the chuck. When a bias must be applied to a detachable chuck, the chuck design must incorporate a releasable connection that makes electrical contact between the cathode and the cable. To ensure good electrical coupling, the releasable connection should make intimate contact at multiple points. Furthermore, the connector should maintain good electrical contact over a wide range of temperatures. Prior art connections have typically made use of "banana" plugs that have a male connector with one or more resilient contact portions that fits into a cylindrical female connector. The resilient contacts make good electrical connection at multiple points. Unfortunately, the male and female connectors must be precisely manufactured and aligned during assembly to ensure consistent connection and disconnection. Repeated connection and disconnection can bend the male connectors out of alignment making connection difficult. Furthermore, the male connectors can break after repeated bending thereby rendering the chuck useless.

One solution to this problem, is to use spring loaded connectors. Typically, a spring loaded connection consists of a coil spring secured to a fixed connection on the pedestal. A conductive button is attached to the free end of the spring. When the chuck is attached to the pedestal, the spring urges the button against a contact on the chuck thereby making the desired electrical connection. For example, U.S. Application Ser. No. 09/071,784 describes a large spring loaded plate that contacts the bottom of the electrostatic chuck to achieve an RF connection. However, such a plate (used for cooling) is not always necessary and may render construction of the chuck and pedestal unduly complex. This type of connector does not require the precise alignment of a banana plug connection. Although this type of connector works well for a DC bias, the impedance of the coil spring produces a sizable voltage drop when a high frequency (e.g. 13.56 MHz) RF voltage is applied.

Therefore, a need exists in the art for a spring loaded releasable RF connection for a substrate support that does not require precise alignment or unduly bulky components.

SUMMARY OF THE INVENTION

The disadvantages associated with the prior art are overcome by the present invention of a RF electrode contact assembly for a substrate support having a detachable susceptor. The substrate support comprises a pedestal and an RF contact assembly that makes releasable electrical connection to a cathode contact disposed within the susceptor. The contact assembly comprises a resilient contact element that provides multiple parallel self-loading electrical connections between a first electrode and a second electrode when the two are forced together. Preferably, the resilient contact element is a canted spring, having multiple coil turns that are tilted in one direction wherein the multiple connections are made along the coil turns. The canted spring is substantially toroidal (doughnut shaped). Such a toroidal shaped spring can be made by joining the ends of a coil spring. The first electrode is typically surrounded by an insulating housing and sleeve that electrically isolate the plunger electrode from the pedestal.

In a first embodiment, the first electrode is a plunger electrode. A spring, urges the plunger electrode against the resilient contact element.

In a second embodiment of the invention the compression of the resilient contact element is limited so that it cannot be compressed beyond a maximum working distance. As an example of this embodiment a canted spring circumscribes a raised tip of the first electrode. The tip has a thickness that is less than a thickness of the canted spring. When the tip makes contact with the second electrode, the resilient contact cannot be compressed further.

In a third embodiment of the invention the contact assembly is sealed to the pedestal by an O-ring, located in an O-ring groove that circumscribes the housing.

In a fourth embodiment, the contact assembly is brazed to the pedestal to make a permanent vacuum tight seal.

The electrical contact of the present invention creates multiple parallel self-loading connections and multiple conducting bodies, via the turns of a canted spring, between a plurality of points on the chuck and a corresponding plurality of points on the pedestal. The coiled turns act like electrical wires to ensure reliable RF electrical energy transfer. The multiple parallel turns have less impedance than an ordinary coil spring. As such, the contact assembly of the present invention provides efficient transfer of RF energy to the cathode. Furthermore, the canted spring contact of the present invention allows for flat contact between the pedestal and the chuck. Loose physical tolerances during manufacture and assembly do not lead to damage of the contact components.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the teachings of my invention can be readily utilized in any application that requires reliable electrical contact in a releasable electrical connector.

Figure 1A:
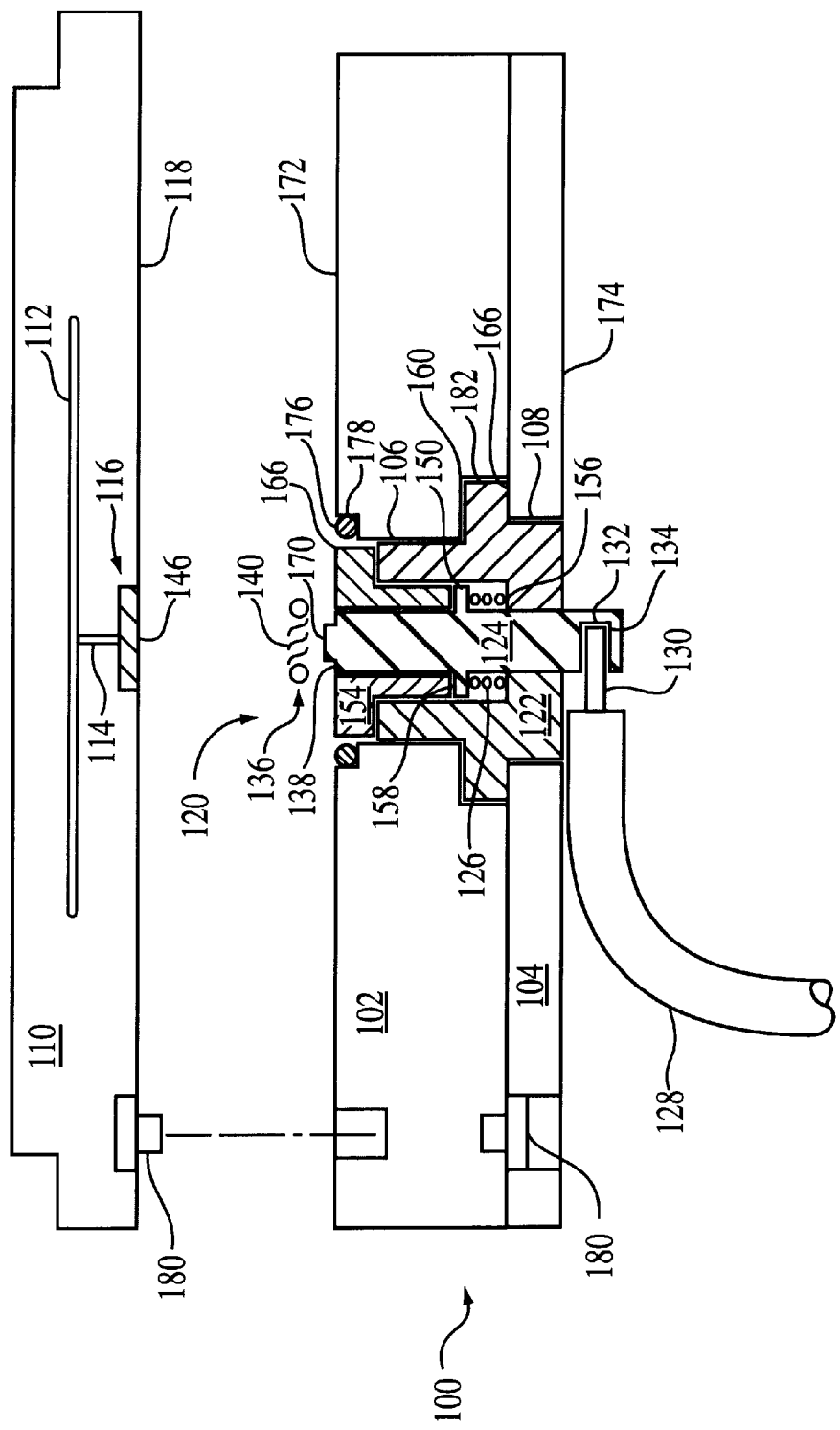
FIG. 1A shows a partially exploded view of a vertical cross section of a substrate support that incorporates an electrical contact assembly according to a first embodiment of the present invention.
Figures 1B, 1C:
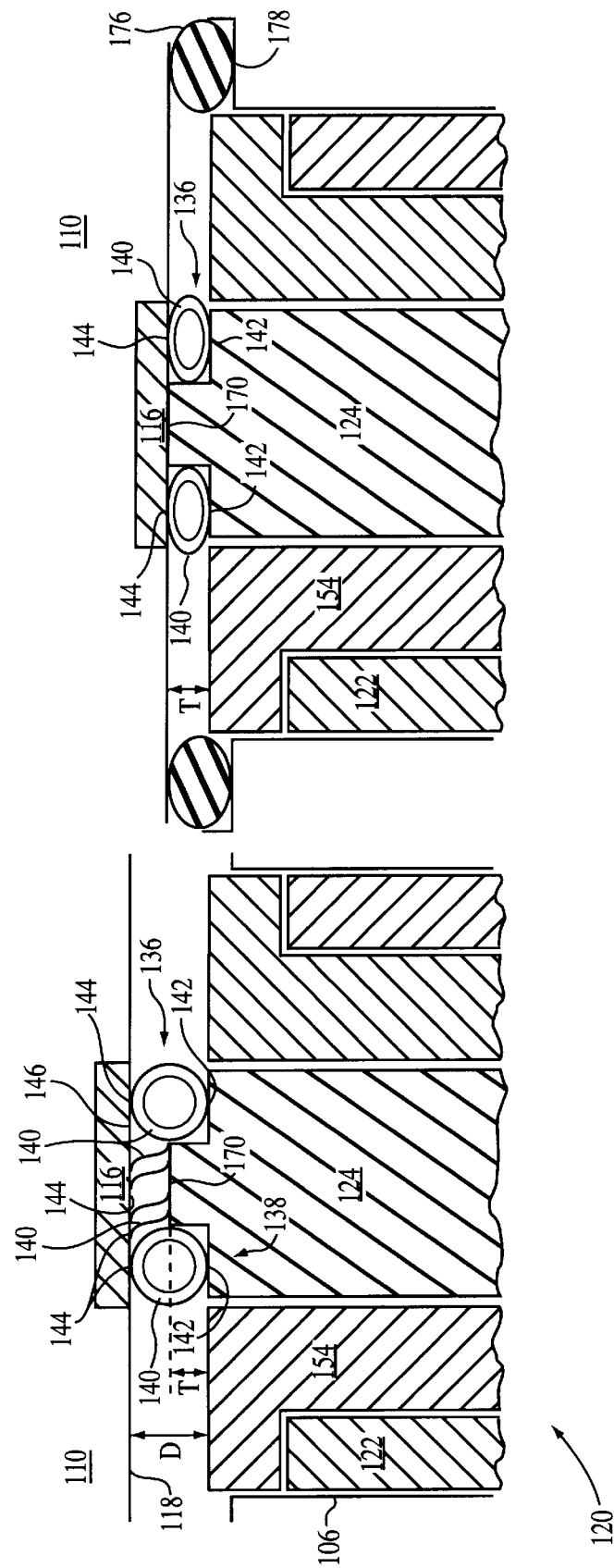
FIG. 1B is a close-up of the contact assembly of the first embodiment of the present invention with the canted spring uncompressed.
FIG. 1C is a close-up of the contact assembly of the first embodiment of the present invention with the canted spring fully compressed.

The present invention is best understood by simultaneously referring to FIGS. 1A, 1B and 1C. FIG. 1A depicts an electrical contact assembly 120 of the present invention employed in a substrate support 90. The substrate support 90 comprises a pedestal 100 and a susceptor 110. The substrate support is part of a semiconductor process chamber such as a Preclean IIe chamber made by Applied Materials of Santa Clara, Calif. The pedestal 100 comprises an upper piece 102 and a lower piece 104. Both pieces can be manufactured from any suitable material. Preferably, the pedestal 100 is manufactured from a high thermal conductivity material such as copper. The upper piece 102 has a bore 106 whose dimensions and characteristics are explained in greater detail below. The lower piece 104 has a bore 108 that is coaxially aligned with bore 106. The upper piece 102 is secured to the lower piece 104 by conventional means such as a plurality of bolts 180. The susceptor 110 is releasably attached to the pedestal 100. The pedestal 100 has a top surface 172 that is exposed to vacuum and a bottom surface 174 that is exposed to air. As such, a seal is necessary between the electrical contact assembly 120 and the pedestal 100. Such a seal is formed by an O-ring 176 disposed in an O-ring groove 178 in the top surface 172. The groove 178 is radially adjacent the bore 106.

The electrical contact assembly 120 is disposed within the bores 106,108 and comprises an insulating housing 122, a plunger electrode 124 and a plunger spring 126. Specifically, the insulating housing 122 is disposed within the bores 106, 108 to electrically insulate the plunger electrode 124 from the pedestal 100. The insulating housing 122 is made from an plastic material such as Vespel®. Vespel® is a registered trademark of the Dupont Corporation of Newark, Del. The plunger electrode 124 is axially aligned with bores 106, 108 and is connected to a voltage source such as an RF power supply (not shown) via an RF cable 128. The RF cable 128 includes a wire 130 that is disposed in a recess 132 in a back end 134 of the plunger electrode 124. The plunger electrode 124 is preferably made from beryllium-copper.

The susceptor 110 can be any type of susceptor typically used in a semiconductor processing chamber such as an electrostatic chuck, a mechanical chuck, a heater or a bias pedestal. Regardless of type, the susceptor 110 contains a cathode electrode 112 electrically coupled, via a conductor 114, to a cathode contact 116 located on a bottom surface 118 of the susceptor 110. A resilient contact element 136 electrically connects the plunger electrode 124 to the cathode contact 116. The resilient contact element is, for example, a toroidal canted spring 136 disposed on a contact end 138 of the plunger electrode 124. The canted spring 136 has a plurality of tilted turns 140. The canted spring 136 can be made from any resilient conductive material. For example, copper and beryllium-copper are suitable materials for low temperature applications (e.g., 200° C. or less). Stainless steel, such as 316 stainless or nickel superalloys such as Inconel® are preferred for high temperature applications, such as in heater pedestals. Inconel® is a registered trademark of Inco Alloys International, Inc., of Huntington, W.Va. Furthermore the surface of the canted spring 136 can be passivated against corrosion by coating with suitable materials such as gold, platinum etc. as is well known in the art. Canted springs suitable for the intended application in the subject invention are available from Bal Seal engineering of Santa Ana, Calif.

The housing 122 is held stationary within the bores 106 and 108 by a radially projecting portion 182. The radially projecting portion 182 fits into a groove 160 in the upper pedestal piece 102 that is radially adjacent the bore 106. The radially projecting portion 182 engages a flange 166 of the lower pedestal piece 104 thereby restricting downward movement of the housing 122. An insulating sleeve 154 circumscribes the plunger electrode 124 adjacent the contact end 138. The sleeve is made of a plastic material such as Vespel®. The sleeve is, in turn, circumscribed by and attached to the housing 122. Attachment of the sleeve 154 to the housing 122 can be accomplished by any suitable releasable means. For example, the housing 122 and sleeve 154 can both be threaded for releasable attachment to each other. Forward motion of the plunger electrode 124 is limited by contact between a radially projecting flange 150 on the plunger electrode and a bottom 158 of the sleeve 154. The plunger electrode 124 has a range of resilient vertical motion due to the plunger spring 126 that circumscribes the plunger electrode 124. The plunger spring 126 is retained between the flange 150 and an inward projecting lip 156 on the housing 122.

When the susceptor 110 is urged against the pedestal 100, the plunger spring 126 urges the plunger electrode 124 against the canted spring 136. The susceptor 110 can be urged against the pedestal 100 by the force of its own weight, by bolts 180, a clamp, or other similar securing means. As shown in FIG. 1B, the turns 140 of the canted spring 136 make multiple electrical connections between a plurality of points 142 on the plunger electrode 124 and a plurality of points 144 on a contact surface 146 of the cathode contact 116. Thus, the turns 140 provide a plurality of parallel electrical connections between the cathode contact 116 and the plunger electrode 124. As such, the electrical connection between the plunger electrode 124 and the contact surface 146 is self-loading and has a low impedance. A low impedance is desirable because it reduces the RF voltage drop across the connection, thereby improving the efficiency of RF energy transfer to the cathode electrode 112. Furthermore, a reduced RF voltage drop reduces the likelihood of arcing between the pedestal 100 and the susceptor 110. Arcing causes damage to the pedestal 100, susceptor 110 or a wafer retained on the susceptor 110.

An additional feature of the invention prevents the canted spring 136 from being compressed beyond its elastic limit. The plunger electrode 124 includes a tip 170 that has a thickness T that protrudes beyond the level of the contact end 138 (see FIG. 1B). The canted spring 136 circumscribes the tip 170. The thickness T is less than an uncompressed diameter D of the canted spring 136. When the plunger electrode 124 is urged against the cathode contact 116 the canted spring 136 compresses until the tip 170 contacts the cathode contact 116 as shown in FIG. 1C. The tip 170 provides additional electrical contact between the plunger electrode 124 and the cathode contact 116. More importantly, the canted spring 136 cannot be compressed by more than a working distance defined by D–T.

Figure 2:
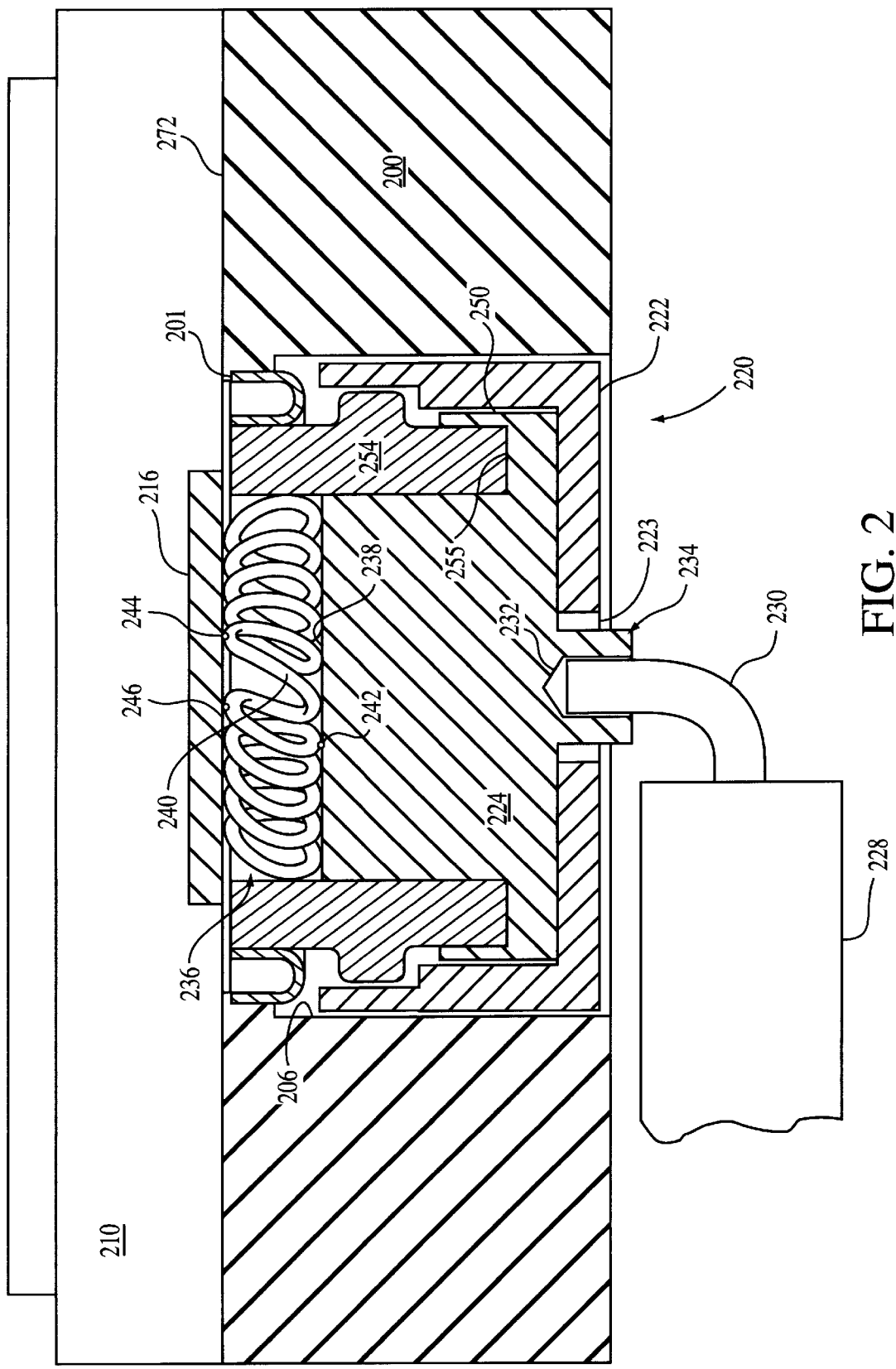
FIG. 2 shows a vertical cross section of a substrate support that incorporates an electrical contact assembly according to a second embodiment of the present invention.

An alternate embodiment of the invention is shown in FIG. 2. An electrical contact assembly 220 is disposed in a bore 206 in a one-piece pedestal 200. Preferably, the pedestal 200 is made of copper. A susceptor 210, having a cathode contact 216 with a contact surface 246, is disposed above the pedestal 200. The contact assembly 220 comprises a RF electrode 224 and a resilient contact element, such as a toroidal canted spring 236, having a plurality of tilted turns 240. The RF electrode 224 is connected to voltage source such as an RF power supply (not shown) via an RF cable 228. The RF cable 228 includes a wire 230 that is disposed in a recess 232 in a back end 234 of the RF electrode 224. The canted spring makes multiple parallel electrical connections between the RF electrode 224 and the cathode contact 216. RF energy from the power supply is conducted along the coil turns 240 between a first plurality of contact points 242 on a contact end 238 of the electrode 224 and a second plurality of contact points 244 on a contact surface 246 of the cathode contact 216.

An insulating sleeve 254 circumscribes the RF electrode 224. A flange 201 circumscribes the sleeve 254. The flange 201 is attached to the sleeve 254 and pedestal 200 to form a vacuum tight seal. Preferably, the flange 201 is welded to the pedestal 200 and brazed to the sleeve 254. The flange 201 is made of a material suitable for accommodating thermal expansion of the sleeve 254 relative to the pedestal 200 at high temperatures (e.g., approximately 800° C. during brazing). Such materials include copper-nickel alloys or other alloys such as Kovar®. Kovar® is a registered trademark of Carpenter Technology Corporation of Reading, Pennsylvania. Preferably, the flange 201 is made from an alloy of 70% copper and 30% nickel. To further accommodate different thermal expansion of the sleeve 254 and the pedestal 200 at high temperatures, such as during welding and brazing, the flange 201 has a "U"-shaped cross section. Alternatively, the flange 201 can be manufactured with a serpentine or zigzag cross section.

The RF electrode 224 has a circumferential flange 250 at the back end 234. The flange 250 has a circumferential groove 255. The sleeve 254 is received in the circumferential groove 255 and thereby restricts upward movement of the RF electrode 224. The diameter of the coil turns 240 is such that they protrude slightly above a top surface 272 of the pedestal 200. The weight of the susceptor 210 compresses the canted spring 236 when placed on top of the pedestal 200. Thus, the turns 240 of the canted spring 236 make multiple parallel resilient contacts between the RF electrode 224 and the cathode contact 216. The space between the top surface 272 and the contact end 238 of the RF electrode 224 is such that the canted spring 236 cannot be compressed beyond a its elastic limit.

An insulating housing 222 surrounds the RF electrode 224 and sleeve 254. The housing 222 is attached to pedestal 200, by brazing or the like, to form a vacuum tight seal. Alternatively, the pedestal 200 and the housing 222 can be threaded for releasable attachment. The housing 222 is substantially cup shaped with an opening 223. The back end 234 of the RF electrode 224 protrudes through the opening 223. The flange 250 engages the housing 222 thereby restricting downward movement of the RF electrode 224. Thus the RF electrode 224 is fixed in place between the housing 222 and the sleeve 254.

The materials of construction should be carefully chosen to minimize the effects of thermal stress when the pedestal is at its operating temperature. For example, the housing 222 should have a coefficient of expansion between that of the flange 201 and the RF electrode 224. The housing 222 and sleeve 254 are, for example, both made of alumina ($Al_2O_3$). Furthermore the choice of materials for the canted spring 236 and the RF electrode 224 in the second embodiment corresponds to that for the canted spring 136 and the plunger electrode 124 respectively in the first embodiment. For example, the canted spring 236 is typically made of Inconel® and the RF electrode 224 is made of beryllium-copper.

All embodiments of the present invention exhibit the same inventive features. Specifically, resilient self-loading connections are provided between two flat electrodes at multiple points. Multiple parallel conducting paths ensure efficient transmission of RF energy to the cathode with minimal losses. Furthermore both embodiments limit the compression of the canted spring beyond a certain working distance.

Although various embodiments which incorporate the teachings of the present invention have been shown and described in detail herein, those skilled in the art can readily devise many other varied embodiments that still incorporate these teachings.

What is claimed is:

1. An electrical contact assembly, for making releasable electrical contact between a first plunger electrode and a second cathode contact electrode, comprising:

a resilient contact element, disposed between said first and second electrodes, that provides a plurality of parallel electrical connections between said first and second electrode and;

a tip on said first plunger electrode wherein said resilient contact element circumscribes said tip, said tip having a thickness T that is less than an uncompressed diameter D of said resilient contact element such that when said tip makes contact with said second cathode contact electrode said resilient contact cannot be compressed beyond a maximum working distance defined by D–T.

2. The electrical contact assembly set forth in claim 1, wherein said resilient contact element is a canted spring, having a plurality of tilted turns.

3. The electrical contact assembly set forth in claim 2, wherein said canted spring is toroidal.

4. The electrical contact assembly set forth in claim 1, further comprising:

a radially projecting flange located on said plunger electrode;

a housing having an inward projecting lip, the housing circumscribing said plunger electrode; and a spring, located between said flange and said inward projecting lip, that provides said plunger with a range of resilient vertical motion.

5. The electrical contact assembly of claim 1 wherein said first electrode has a radial flange with a circumferential groove.

6. The electrical contact assembly of claim 5 further comprising:

an insulating sleeve that circumscribes said first electrode, said sleeve being received in said groove; and a flange, circumscribing said sleeve.

7. The electrical contact assembly of claim 5 further comprising a cup shaped insulating housing that circumscribes said first electrode.

* * * * *